United States Patent [19]
Zhang et al.

[11] Patent Number: 6,146,917
[45] Date of Patent: Nov. 14, 2000

[54] FABRICATION METHOD FOR ENCAPSULATED MICROMACHINED STRUCTURES

[75] Inventors: Xia Zhang, Canton, Mich.; David G. McIntyre, Monument, Colo.; William Chi-Keung Tang, Arcadia, Calif.

[73] Assignee: Ford Motor Company, Dearborn, Mich.

[21] Appl. No.: 08/810,387

[22] Filed: Mar. 3, 1997

[51] Int. Cl.[7] .................................................. H01L 29/82
[52] U.S. Cl. ............................ 438/51; 438/52; 438/456; 257/415; 257/787
[58] Field of Search .................................. 438/51, 52, 53, 438/456, 619; 257/415, 417, 420, 790, 794, 788, 787

[56] References Cited

U.S. PATENT DOCUMENTS

| | | | |
|---|---|---|---|
| 5,097,317 | 3/1992 | Fujimoto et al. | 257/786 |
| 5,404,749 | 4/1995 | Spangler | 73/514.32 |
| 5,447,068 | 9/1995 | Tang | 73/514.32 |
| 5,504,356 | 4/1996 | Takeuchi et al. | 257/415 |
| 5,676,851 | 10/1997 | Suzuki et al. | 438/456 |
| 5,731,229 | 3/1998 | Kato et al. | 438/50 |
| 5,798,557 | 8/1998 | Salatino et al. | 257/416 |
| 5,837,562 | 11/1998 | Cho | 438/51 |

FOREIGN PATENT DOCUMENTS

| | | | |
|---|---|---|---|
| 40 4062877 | 2/1992 | Japan | 257/415 |
| 40 6112548 | 4/1994 | Japan | 257/415 |

*Primary Examiner*—Donald L. Monin, Jr.
*Assistant Examiner*—Michael Dietrich
*Attorney, Agent, or Firm*—Mark L. Mollon

[57] ABSTRACT

A process for the preparation of hermetically sealed electronically active microstructures involves the preparation of a plurality of microstructures and associated conductive paths and lead bond areas on a single wafer such that areas surrounding the microstructures are maintained in a planar condition. A second wafer having a plurality of microstructure-receiving cavities is placed atop the first wafer and fusion or anodically bonded. The microstructures are preferably connected to lead bond pads which lie outside the surround, the second wafer also having bond pad accessing through-holes to facilitate bonding electrical leads to the devices after sawing from the wafer. The lead-connected devices may be further encapsulated by injection molding, potting, or other conventional encapsulative packaging techniques.

19 Claims, 6 Drawing Sheets

FABRICATION METHOD FOR ENCAPSULATED MICROMACHINED STRUCTURES

TECHNOLOGICAL FIELD

The present invention pertains to electronically active, micromachined structures and to a method for their encapsulation. Examples of such structures are micromachined accelerometer sense elements.

DESCRIPTION OF THE RELATED ART

Physical and chemical micromachining techniques, many of which were originally developed in connection with integrated circuit and microprocessor fabrication, have enabled the production of micromachined structures which are electronically "active" in the sense that the structures move, deform, or are stressed due to changes in the physical environment of the structure, and one or more electrical properties associated with the structures are altered as a result. For example, such micromachined structures may be sensitive to stimuli such as change in temperature, acceleration, force, and the like. The electronic activity associated with the device may represent a change in a digital condition, or a change in capacitance, resistance, inductance, or the like.

For example, a torsion beam accelerometer may be micromachined from silicon as illustrated by U.S. Pat. No. 5,488,864. In such accelerometers, dual tilt plates, one of higher mass, are suspended by a torsion beam. Upon acceleration, the greater inertia of the higher mass plate will cause the tilt plates to rotate about the torsion beam axis. This rotation may be reflected by changes in capacitance between the heavy side and light side tilt plates and conductive pads located below them on the base of the structure, or by other means. Devices such as that just described are very tiny, and are manufactured by semiconductor processing techniques. Other accelerometers and microstructure devices are disclosed in U.S. Pat. Nos. 5,447,068; 5,404,749; 5,352,635; 4,945,773; and 5,188,983; which are herein incorporated by reference. Their changing capacitance may be translated into a signal reflective of acceleration by circuitry such as that disclosed in U.S. Pat. No. 5,495,414.

Manufacturing and device packaging associated with such transducers present unique problems due to the physically active nature of the microstructures. To maintain a stable environment and to keep out dust particles, corrosive and/or potentially fouling vapors, etc., the micromachined structures must be enclosed within a sealed package. Traditional integrated circuit encapsulation methods such as epoxy resin potting and thermoplastic injection molding, while useful with integrated circuits which have no moving parts, are incapable of use directly with micromachined structures. The encapsulant must not contact the active portions of the micromachined structure. Moreover, common encapsulation techniques such as injection molding, often requiring pressures of 1000 psi, would easily crush the microstructure.

In addition to protecting the microstructure during use, the structure must also be protected during post-fabrication processing. For example, such microstructures are produced by processing many identical devices or a single silicon wafer substrate. Following the various micromachining steps, i.e., deposition, masking, etching, ion implantation, and diffusion steps, the finished devices must be separated by sawing the wafer. Many devices are damaged in such operations.

In U.S. Pat. No. 5,188,983, a method of encapsulating a micromachined accelerometer sense element is disclosed wherein the active sense elements are deposited on a sacrificial layer, and a further sacrificial layer is applied over and encompassing the structure, the sacrificial layer having an external shape corresponding to the internal dimensions of the desired encapsulating cavity. Polysilicon is then deposited, forming a shell around the device, this shell having numerous flow channels located along its periphery. The sacrificial layers are then etched away by chemical etchant flowing through the peripherally located flow channels, the device thoroughly washed, evacuated, and the flow channels sealed.

Both the process as well as the device disclosed in the '983 patents have numerous drawbacks. Deposition of the additional sacrificial layer and polysilicon shell elevate the processing cost and processing time. More importantly, however, the etching away of the sacrificial layers by means of etchant flowing through the rather small peripheral flow channels is troublesome. In addition to being relatively inefficient, the etching cannot be made completely uniform. If particles slough into the interior of the cavity, they may not be able to escape the cavity through the small flow channels in the shell, and thus the yield of useable devices will be affected. Moreover, while helpful to lessen microstructure damage during wafer sawing operations, the polysilicon shell is too fragile to withstand injection molding pressure, and thus further encapsulation methods are restricted.

It would be desirable to be able to encapsulate an electronically active micromachined structure within a cavity by simple and time efficient techniques in high useable device yield. It would be further desirable to be able to provide encapsulated devices with chemically well defined surfaces on the structural components and with selectable cavity atmosphere. It would be yet further desirable to provide encapsulated devices which may be further encapsulated by traditional potting and injection molding techniques without damage or alteration to the microstructure.

SUMMARY OF THE INVENTION

A cost-effective method of encapsulating active micromachined structures within a cavity has been developed which not only provides a suitable working cavity for the structure, but which also protects the structure during subsequent wafer sawing and further device encapsulation. The method involves fabrication of multiple, active, micromachined structures on a single silicon wafer in such a manner that wafer planarity surrounding the individual microstructure is maintained; etching or otherwise providing respective corresponding cavities in a second wafer of silicon, glass, or glass-coated silicon; aligning the second wafer atop the first wafer such that the microstructures are positioned within their respective cavities; and fusion bonding or anodically bonding the wafers together. The wafer is then sawed to obtain individual silicon-encapsulated microstructures. The microstructures preferably contain one or more access windows which allow bonding of leads to the necessary conductive paths. However, the access windows do not communicate with the device cavities. Following lead bonding, the devices may be further encapsulated by known methods, including resin potting and injection molding.

DESCRIPTION OF THE PREFERRED EMBODIMENTS

Figure 1:
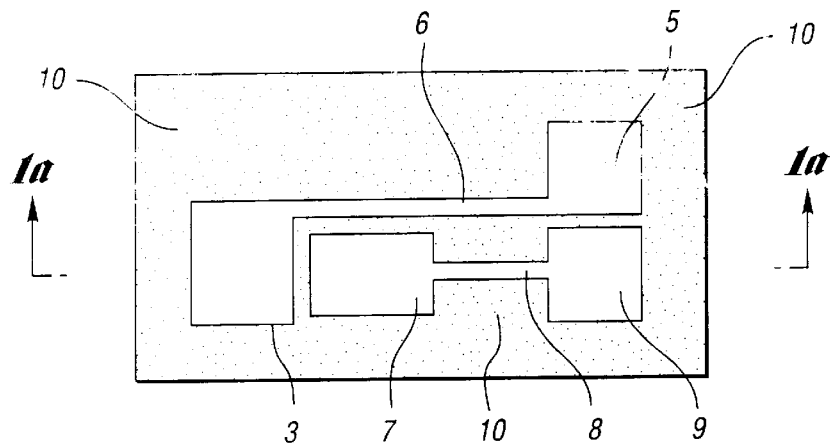
FIG. 1 illustrates a plan view of a portion of a silicon wafer during one stage of fabrication of a cantilever-type accelerometer microstructure sense element and its subsequent encapsulation according to one embodiment of the subject process, illustrating formation of conductive areas on the wafer.

In its most basic form, the subject invention involves micromachining from a single wafer, multiple microstructure devices, complete with conductive paths leading to bonding pads remote from the devices to facilitate attaching electrical leads, the micromachining being performed in such a manner as to leave the surface surrounding the microstructure planar. The planar surround allows subsequent fusion bonding of a further silicon wafer, or anodic bonding of a further glass wafer, or glass-coated silicon wafer atop the first, resulting in a fully sealed and robust device to which the appropriate electrical leads may be attached and the device further encapsulated using conventional techniques. The particular micromachining, diffusion, ion implantation, etching steps, etc., are not overly critical except insofar as a planar surround is maintained, preferably with a planarity which is the same or substantially the same as the silicon wafer on which the devices are fabricated. It should be noted, however, that subsequent to the initial formation of conductive areas (pads, paths, etc.) on the silicon wafer by diffusion, subsequent processing steps such as deposition, annealing, and fusion bonding should be selected so as not to unduly disturb the initial diffusion. Those skilled in the art can readily adjust the necessary processing parameters. For example, the initial diffusion may be performed at a temperature somewhat higher than that customarily used, and the time and temperature of subsequent steps reduced accordingly.

Suitable chemical and physical micromachining steps, including those used to form pn junctions, conductive surfaces and/or paths, pads, etc., are by now well known to those skilled in the art. Reference may be had to U.S. Pat. Nos. 4,945,773; 5,188,983; 5,352,635; and 5,488,864; and various publications, i.e. Y. B. Gianchandani and K. Najafi, *A Bulk Silicon Dissolved Wafer Process For Microelectromechanical Devices,* IEEE J. OF MICROELECTROMECH. SYST., vol. 1, pp.77–85, June 1992; R. T. Howe, *Surface Micromachining For Microsensors And Actuators,* J. VAC. SCI. TECH., vol. B6, pp. 1809–1813, 1988; H. Seidel, L. Csepregi, A. Heuberger, and H. Baumgärtel, *Anisotropic Etching Of Crystalline Silicon In Alkaline Solutions: I. Orientation Dependence And Behavior Of Passivation Layers,* J. ELECTROCHEM. SOC., vol. 137, pp. 3612–3626, November 1990; A. Hanneborg, *Silicon Wafer Bonding Techniques For Assembly Of Micromechanical Elements,* Proc. IEEE MICRO ELECTRO MECH. SYST. WORKSHOP, Nara, Japan, pp. 92–98, January/February 1991; and W. C. Tang, Digital Capacitive Accelerometer, U.S. Pat. No. 5,447,068. All these patents and publications are herein incorporated by reference.

The particular microstructure is not critical to the process or device of the present invention. Suitable microstructures include those cited in the foregoing patent and literature references, for example, as well as others, and include strain gauge pressure transducers, resonant strain gauges, vibratory transducers, lateral and orthogonal accelerometer transducers, and the like. The process is particularly suitable for a wide variety of accelerometer transducers.

Following the micromachining of the multiple, electronically active microstructures on the silicon wafer, a second silicon wafer is etched so as to contain cavities of a size suitable to enclose the active portions of the microstructures. The two wafers are then sandwiched together and heated to fusion bond the cavity-providing wafer to the microstructure-providing wafer along the planar surrounds around each microstructure. In order to provide for bonding electrical leads, the cavity-providing wafer is generally etched so as to contain a plurality of sets of one or more access windows, each window of which correspond to the location(s) of one or more bonding pads. The atmosphere in the bonding chamber may be varied from a vacuum to a modest pressure. The gas, or residual gas in the case of a vacuum, may be varied to suit the application, i.e. may be dry nitrogen, carbon dioxide, helium, argon, or other gas mixtures, including moist gas if appropriate. The atmosphere of the bonding chamber will then become the cavity atmosphere.

In lieu of a second silicon wafer, a glass wafer or a glass coated silicon wafer, in either case containing the necessary cavities and access windows, may be anodically bonded to the first, microstructure-containing wafer. Anodic bonding techniques are well known to those skilled in the art. An advantage of anodic bonding is that it may be effected at lower temperatures, i.e., in the range of 400° C. to 500° C. Thus, this method may be preferable for microstructures which are temperature sensitive. Fusion bonding of silicon is preferred for most applications, however, as the hermeticity is generally superior to that which is obtained by anodic bonding, and the coefficients of thermal expansion of the microstructure wafer and encapsulating wafer are identical. In this respect, a glass coated silicon encapsulating wafer provides both close matching of thermal expansion coefficients and a low bonding temperature.

The use of the subject invention may now be described with reference to the Figures. FIGS. 1 to 8 describe one embodiment of the subject process as it pertains to manufacture of a cantilever-type accelerometer sensor. The subject process is, of course, applicable to other types of accelerometer sensors as well as sensors of a variety of different types. FIG. 9, for example, illustrates a different microstructure sensor. In each Figure, a plan view of a portion of the wafer being processed is given together with a cross-section across a section a—a of the wafer. Further cross-sectional views represent processing steps immediately prior to the main Figure where appropriate. Steps such as photolithographical resist deposition, resist removal, etc., which are well understood to those skilled in the art, are omitted for purposes of brevity and clarity. It should be understood that many such microstructures will be machined simultaneously on the same wafer.

In FIG. 1, a polished, p-type silicon wafer 1 is coated with a photoresist mask using traditional photolithography techniques, the bare areas being subjected to ion implantation or diffusion with phosphorus or arsenic to form n+ doped regions 3, 5, 7, 9 and conductive paths 6 and 8, electrically isolated from the p-type substrate by the pn junctions formed. Region 3 is destined to be the support surface for the active, acceleration-deflective cantilever, and also to provide electrical continuity with the cantilever. Region 5 will serve as a bond pad to subsequently bond an electrical lead, electrical communication between the support surface 3 and bond pad 5 being provided by conductive path 6. Region 7 is the bottom electrode and serves as a fixed plate of a variable capacitor, the second, moveable plate, being the cantilever. The bottom electrode 7 communicates via conductive path 8 with bond pad 9.

Figure 1A:
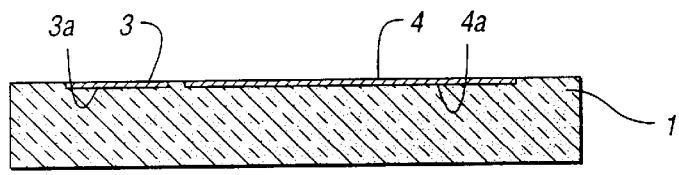
FIG. 1a illustrates a cross-section across 1a—1a of FIG. 1.

Following removal of the photoresist, the portion of the wafer in cross-section 1a—1a is shown in FIG. 1a. At 3 is the ion-implanted (or diffused) n+ region corresponding to the cantilever support surface, while at 4 is the n+ region corresponding to bottom electrode, conductive path 8, and bond pad 9. At 3a and 4a is a pn junction formed at the diffusion boundary which electrically isolates the n+ regions from the substrate. Optionally, a metal lift-off step or other metallization process may be used to metallize bond pads 5 and 9 to enhance the final lead bonding operations. Note that during this process, the area 10 surrounding the various pads, etc., has not been subject to any silicon etch or deposition, and hence retains its planarity, being mutually coplanar with other similar areas around other microstructures on the same wafer. Further, conductive paths 6 and 8, as is also the case with conductive regions 3, 5, 7, and 9, having been doped by ion implantation and/or diffusion, are also flush with the original substrate surface.

Figure 2:
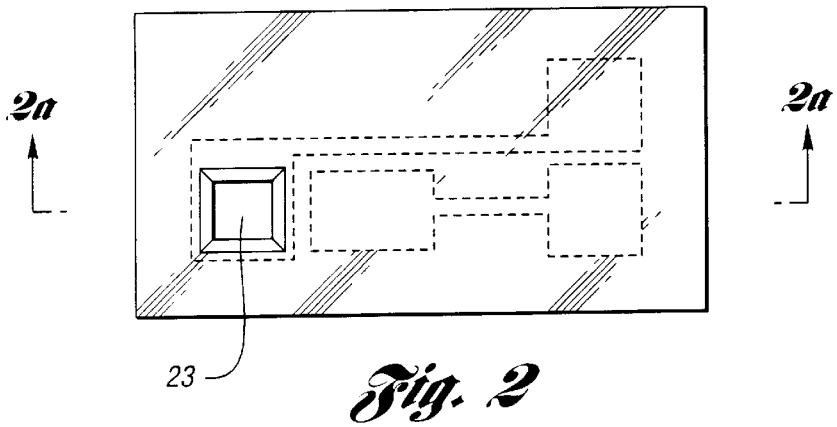
FIG. 2 illustrates a plan view of a portion of a silicon wafer during a further stage of fabrication of a cantilever-type accelerometer microstructure sense element and its subsequent encapsulation according to one embodiment of the subject process.
Figure 2A:
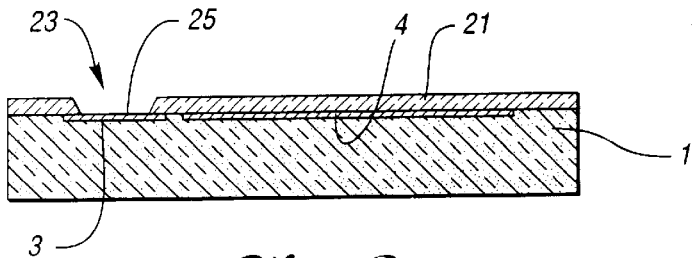
FIG. 2a illustrates a cross-section across 2a—2a of FIG. 1.

Referring now to FIGS. 2 and 2a, a layer of 2 μm to 5 μm thick low temperature silicon oxide (LTO) (21, FIG. 2a) is deposited by LPCVD and densified at 1000° C. for one hour. A second photolithography step is used to bare an "anchor" window 23 communicating with the support surface 25 (3, FIG. 1) onto which the cantilever anchor will be deposited. An additional photolithography step may be used to etch dimples in the LTO which will subsequently allow casting of anti-sticking bumps on the underside of the microstructure, i.e. on the lower side of the cantilever and above the surface of the bottom electrode (7 in FIG. 1).

Figure 3:
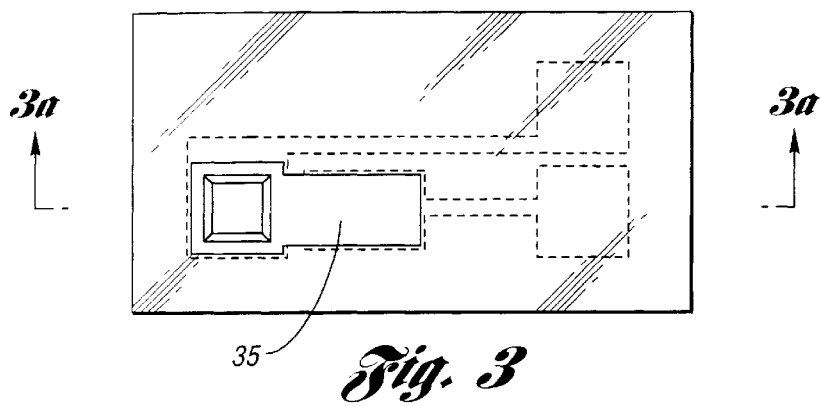
FIG. 3 illustrates a plan view of a portion of a silicon wafer during another stage of fabrication of a cantilever-type accelerometer microstructure sense element and its subsequent encapsulation according to one embodiment of the subject process, showing cantilever deposition.
Figure 3A:
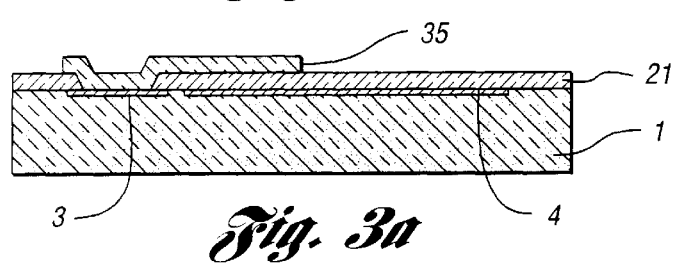
FIG. 3a illustrates a cross-section across 3a—3a of FIG. 1.
Figure 3B:
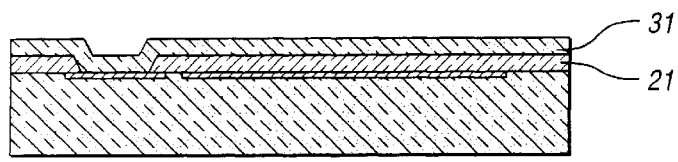
FIG. 3b illustrates the cross-sectional structure of FIG. 3 across 3a—3a prior to etching away the remainder of the deposited polysilicon.

As shown in FIG. 3b, in situ phosphorus doped polysilicon 31 is deposited uniformly to a thickness of 2 μm to 5 μm by LPCVD. A subsequent optional annealing (1000° C., 1 hour) reduces the built-in stress in the polysilicon layer. Alternatively, undoped polysilicon can be used for layer 31 if the topmost portion of layer 21 is phosphosilicate glass (PSG) instead of LTO. Phosphosilicate glass may also be deposited by LPCVD. In such a case, the phosphorus atoms from the PSG diffuse into the polysilicon layer during the subsequent annealing, doping the latter to render it conductive. At the same time, the bottommost LTO portion of layer 21 prevents further doping of the silicon substrate 1. The cantilever 35 (FIGS. 3, 3a) is created by applying a resist of the desired cantilever outline photolithographically, and using a plasma etch or reactive-ion etch (RIE) to remove unwanted polysilicon from around the cantilever microstructure.

Figure 4:
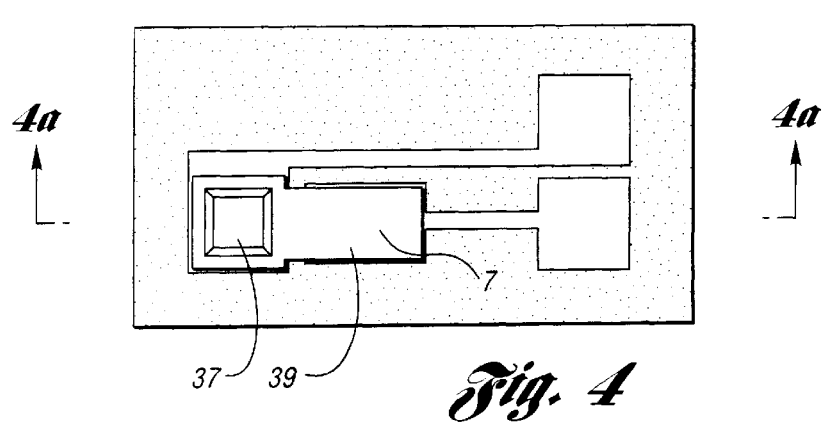
FIG. 4 illustrates a plan view of a portion of a silicon wafer during one stage of fabrication of a cantilever-type accelerometer microstructure sense element and its subsequent encapsulation according to one embodiment of the subject process, showing release of the cantilever by removal of sacrificial glass layer.
Figure 4A:
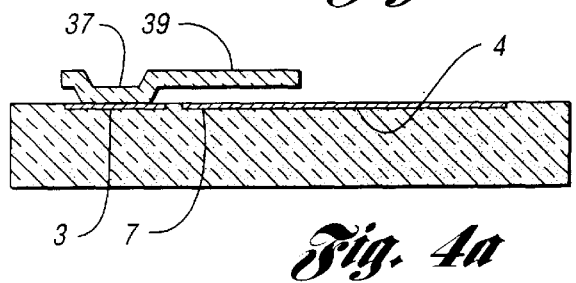
FIG. 4a illustrates a cross-section across 4a—4a of FIG. 1.

Referring now to FIGS. 4 and 4a, the sacrificial LTO layer 21 (FIG. 3) is removed by dissolving with hydrofluoric acid, exposing the released cantilever 35 anchored to support area 3 by anchor portion 37, the active portion 39 suspended above bottom electrode 7. The hydrofluoric acid solution does not attack silicon and polysilicon. At this stage, device testing may be conducted by contact the appropriate bonding pads with test leads.

Figure 5:
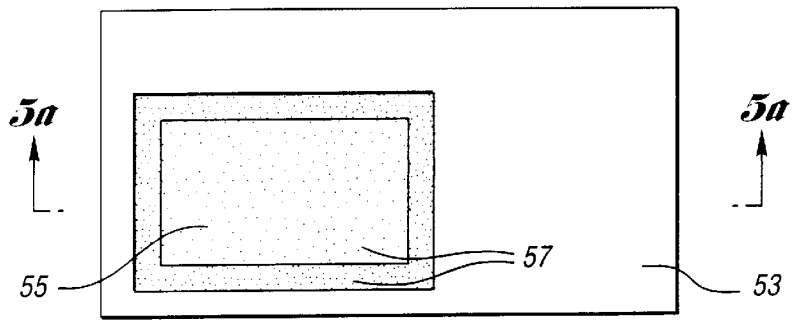
FIG. 5 illustrates a plan view of a portion of a silicon wafer during one stage of fabrication of a cantilever-type accelerometer microstructure sense element and its subsequent encapsulation according to one embodiment of the subject process, showing formation of a time-etched encapsulation cavity in a second wafer.
Figure 5A:
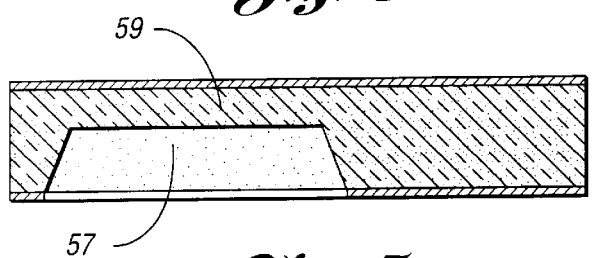
FIG. 5a illustrates a cross-section across 5a—5a of FIG. 1.
Figure 5B:
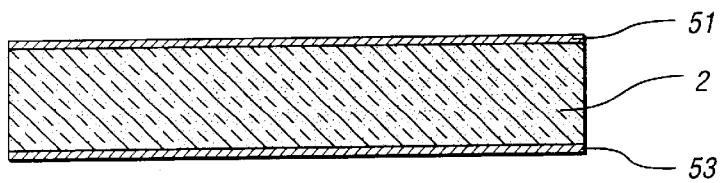
FIG. 5b illustrates the cross-sectional structure of FIG. 5 across 5a—5a prior to removing etch resist and forming the encapsulating cavity.

The devices must now be encapsulated. Referring to FIGS. 5, 5a and 5b, a second p-type silicon wafer 2, for example one having a thickness of c.a. 150–250 μm, has silicon nitride deposited on both sides by LPCVD as shown in FIG. 5b, the upper silicon nitride layer shown as 51 and lower silicon nitride layer as 53. With reference to FIG. 5, a photolithography step applies etch resist to all but a rectangular portion 55 of the bottom silicon nitride surface 53. A plasma etch removes silicon nitride from portion 55, following which a time-etched cavity 57 is prepared by immersing the wafer into a strongly alkaline KOH solution. The predefined cavity depth may range from 50 to 150 μm depending upon the working depth required to contain the microstructure to be encapsulated. Deeper or more shallow cavities may be prepared as well. The depth is, of course, limited by the thickness of wafer 2. The roof 59 of the cavity should preferably be between 70 μm and 25 μm thick. Following cavity preparation, wet chemistry is used to strip away the silicon nitride mask.

Figure 6:
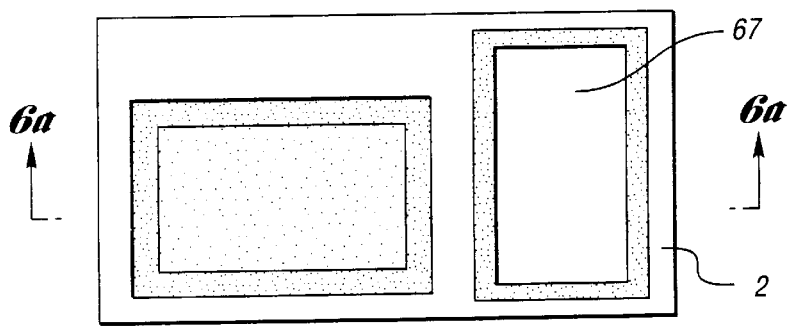
FIG. 6 illustrates a plan view of a portion of a silicon wafer during one stage of fabrication of a cantilever-type accelerometer microstructure sense element and its subsequent encapsulation according to one embodiment of the subject process, showing formation of an access window.
Figure 6A:
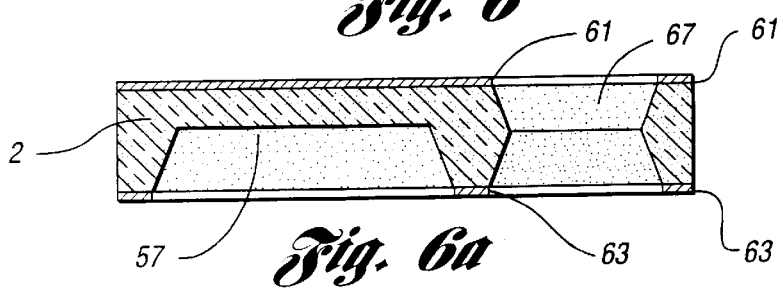
FIG. 6a illustrates a cross-section across 6a—6a of FIG. 1.
Figure 6B:
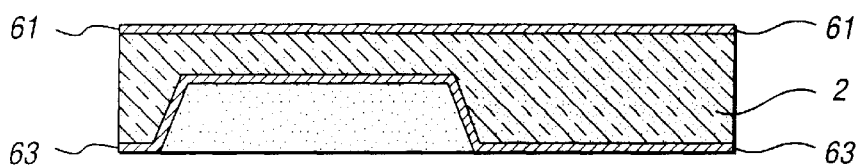
FIG. 6b illustrates the wafer of FIG. 6 across 6a—6a prior to plasma etching windows in the silicon nitride coating as shown in FIG. 6c.
Figure 6C:
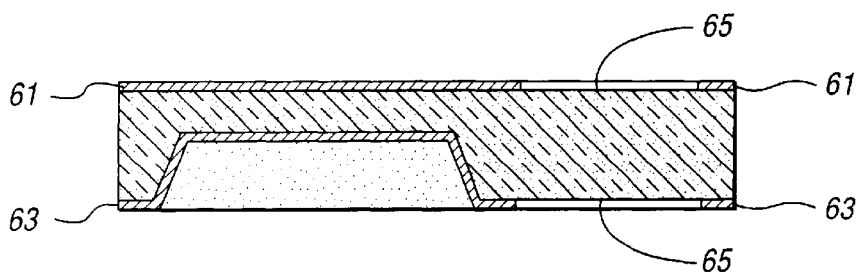
FIG. 6c illustrates the wafer of FIG. 6 across 6a—6a after formation of the windows in the mask of FIG. 6b but prior to the etching through of the wafer to provide the access windows of the wafer of FIG. 6.
Figure 7:
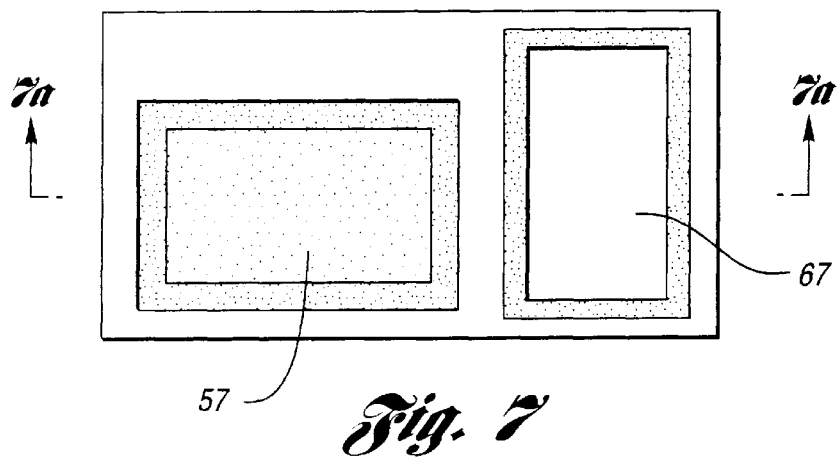
FIG. 7 illustrates a plan view of a portion of a silicon wafer during one stage of fabrication of a cantilever-type accelerometer microstructure sense element and its subsequent encapsulation according to one embodiment of the subject process, showing the finished cavity and access window in the encapsulating wafer prior to fusion bonding atop a first wafer.
Figure 7A:
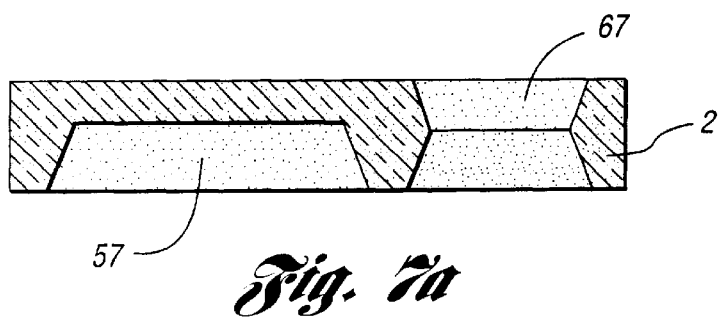
FIG. 7a illustrates a cross-section across 7a—7a of FIG. 1.

A bonding access window is now created by again depositing silicon nitride on both sides of wafer 2 forming top silicon nitride layer 61 and lower layer 63, as shown in FIG. 6b. A photolithographically deposited resist followed by plasma nitride etch removes silicon nitride at areas 65, as shown in FIG. 6c. A strongly alkaline etch dissolves away the p-type silicon, leaving a through-window bonding access hole 67 (FIGS. 6, 6a). The silicon nitride mask is then stripped leaving a top, encapsulating wafer having a plurality of encapsulating cavities 57 and access windows 67 a single pair of which are shown in FIG. 7 and 7a. Similar steps may be used to form microstructure cavities and bond access windows from glass or glass-coated silicon encapsulating wafers.

Figure 8:
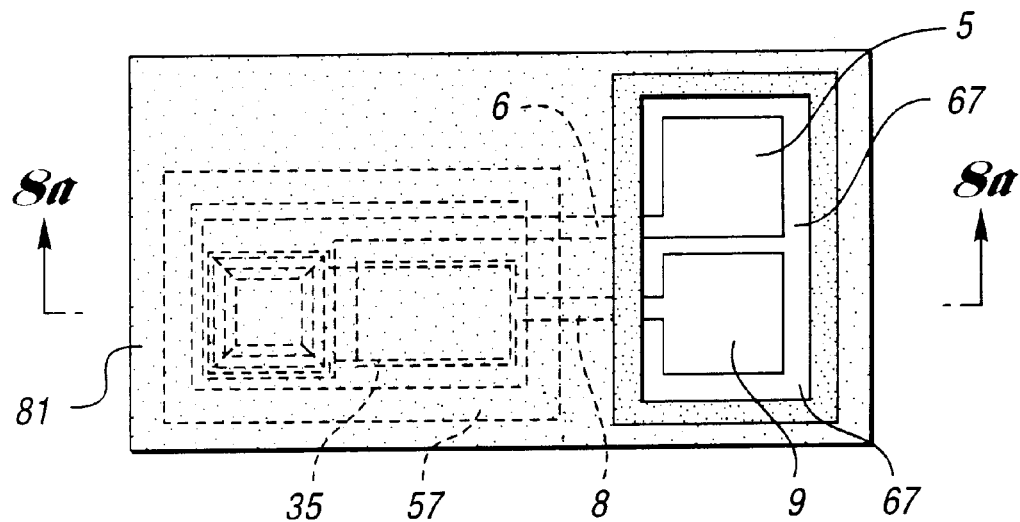
FIG. 8 illustrates a plan view of an encapsulated cantilever-type accelerometer sense element with access window to exposed lead bond pads.
Figure 8A:
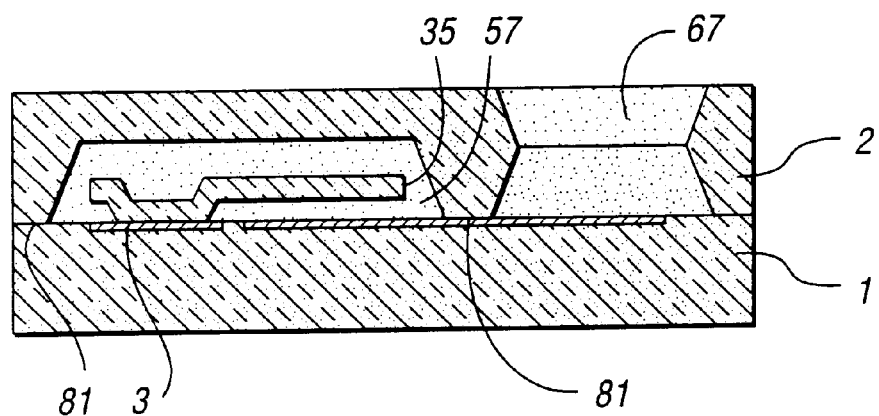
FIG. 8a illustrates a cross-section across 8a—8a of FIG. 1.
Figure 9:
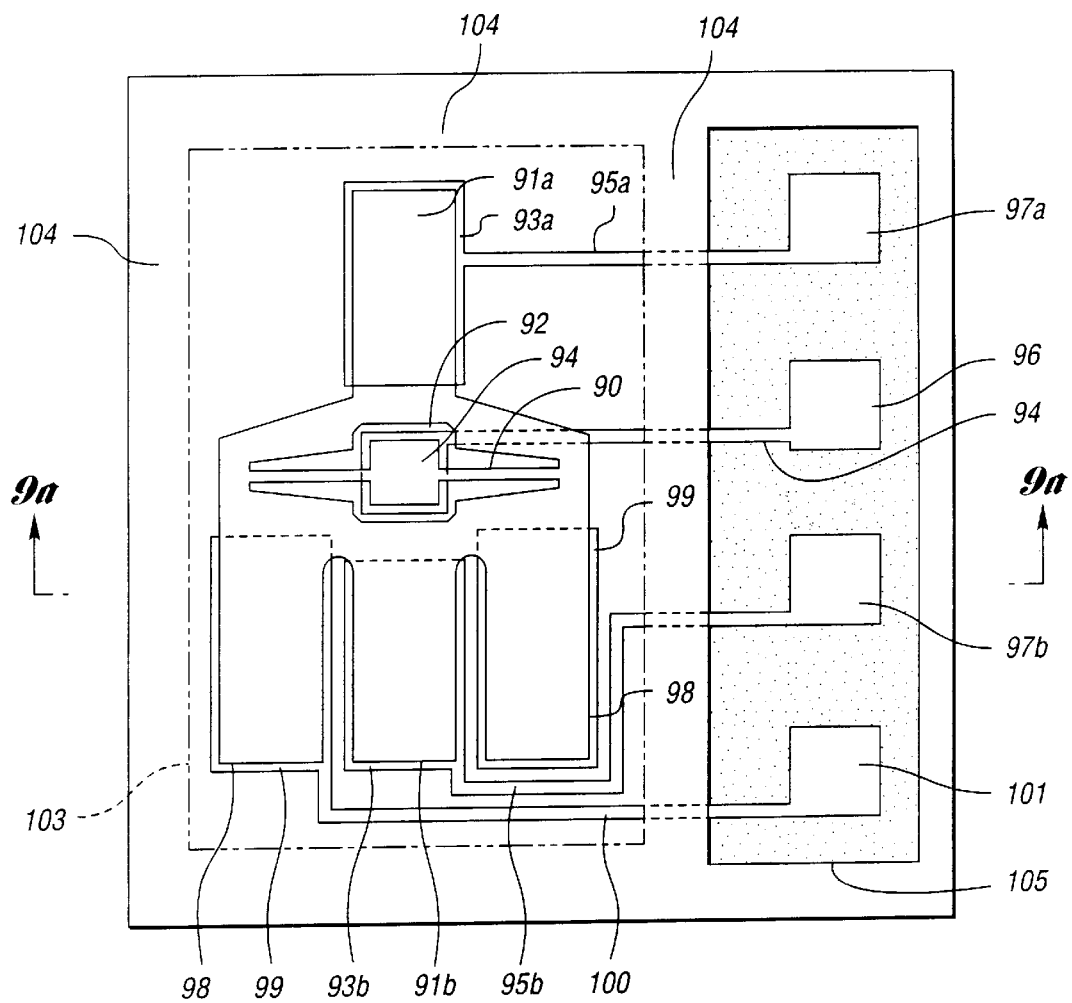
FIG. 9 illustrates a plan view of an encapsulated torsion beam accelerometer.

As shown in FIGS. 8 and 8a, the top wafer 2 is indexed over the bottom wafer 1 following conventional cleaning and hydrating, and pressed together to initiate contact, followed by heating at 1000° C. for one hour to form a silicon-to-silicon fusion bond. In FIG. 8, the cantilever 35 which must move in response to acceleration orthogonal to the face of the wafer/device, is encapsulated within cavity 57. Due to the planarity of the surfaces surrounding the active device (cantilever) and the planarity of the encapsulating wafer 2, an impenetrable fusion bond 81 is formed around the microstructure. Note that the conduction paths 6 and 8 are also planar, having been provided by ion implantation, diffusion, or other techniques which leave a planar surface, hence the hermetic seal 81 extends across these paths. The lead bond pads 5 and 9 are exposed by access window 67, facilitating the bonding of electrical leads by conventional techniques. Following the fusion of encapsulating wafer 2 onto microstructure-carrying wafer 1, or anodic bonding in the case of glass or glass-coated silicon encapsulating wafers, the wafer may be sawed or otherwise processed into discrete components by conventional means, in excellent useable device yield.

While the subject process has been described in relation to a cantilever-type accelerometer sense element microstructure, it is certainly not limited thereto. Other active microstructure devices requiring encapsulation such as tilt plate accelerometers, lateral accelerometers, strain gauges, and the like may be encapsulated by the inventive method as well.

Referring to FIG. 9, a tilt plate, torsion beam accelerometer is shown in plan and in cross-section. At 91a and 91b are the upper "sensing" plates. Below the sensing plates at 93a and 93b are the respective lower electrodes, connected via conductive paths 95a and 95b to bond pads 97a and 97b. At 92 is a conductive "anchor" pad on which polysilicon pedestal 94 and torsion beam 90 have been deposited. Anchor pad 92 is connected to sense element bond pad 96 through conductive path 94. Portion 98 of the sense element, in conjunction with associated lower plate 99, conductive path 100, and bond pad 101, provides a self test function. The sense element microstructure will be enclosed in a cavity provided by the encapsulating wafer. The outer dimensions of the cavity are shown by dotted line 103. The bond pads will be accessed through an access window through the encapsulating wafer, the outline of which is shown by solid line 105. Surrounding the microstructure is fusion bonded surround 104.

Figure 9A:
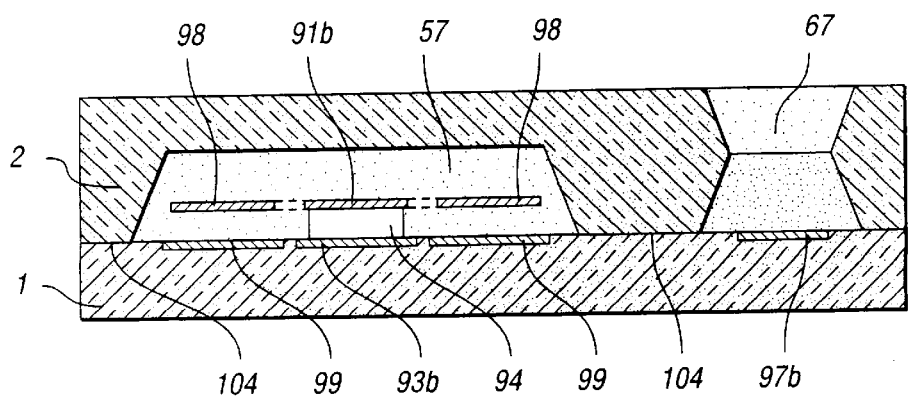
FIG. 9a illustrates a cross-section across 9a—9a of FIG. 1.

A cross-section across 9a—9a is shown in FIG. 9a. The lower test plates 99 and sensing plate 93b as well as bond pad 97b are preferably created as conductive doped areas as described previously, although plates 93b and 99 may be metallized if desired, as these will reside within cavity 57 in encapsulating wafer 2. At 67 is the access window to the bond pads, while at 104, the surround is shown fusion bonded to the encapsulating wafer.

Maintenance of substantial planarity surrounding the microstructure is necessary in order to satisfactorily bond the microstructure wafer and the encapsulating wafer, whether fusion bonding or anodic bonding is contemplated. This planarity must in general be maintained by avoiding steps which significantly etch the areas surrounding the microstructure, which may be termed the "fusion bond surround" or "bond surround". The term "fusion bond surround" is retained when anodic bonding is contemplated as well. By the same token, substantial deposition onto the bond surround areas is undesirable as well. However, it would be within the spirit of the invention to employ etching or deposition steps where the planarity of the bond surround is evenly maintained, or is restored by micromachining, laser ablation, or other techniques. Further, rather than creating the micromachined microstructure above the surface of the polished wafer, it is possible to first etch cavities in the microstructure wafer and micromachine the relevant microstructures within the cavity such that the cavity and microstructure-containing wafer may be sealed by applying a flat wafer atop the cavity and microstructure-containing wafer. The bonding still occurs along the bond surround.

By the term "electronically active microstructures" is meant a microstructure whose electrical characteristics change in response to an external stimulus. Electronically active devices may produce an output voltage or current in response to such stimulus, or may be passive in the sense that the electronically active microstructure exhibit a change in resistance, inductance, capacitance, or digital state. By "mutual coplanar condition" as that term pertains to the fusion bond surrounds is meant a condition of planarity such that upon superposition of a second, planar wafer atop the first wafer, the coplanarity is such that there will be substantially uniform contact between fusion bonding surrounds over the greatest part, preferably all, of the microstructure-containing wafer, and the bonding surround-contacting faces of the second wafer, whether the second wafer is silicon, glass, glass-coated silicon or equivalent bondable encapsulating wafer. If substantial coplanarity is not maintained, device yield will suffer due to non-contacting surfaces not being bonded.

By the term "cavities defined between the surfaces of the wafers" and like terms is meant that the complete cavities will be formed upon the fusion of the two wafers. All or only a portion of the individual cavities may be in any one wafer. Preferably, the entire cavity is etched in the second, encapsulating wafer. By the term "respective" is meant the particular cavity destined to enclose a particular, corresponding microstructure. The microstructures and their respective cavities will generally form a two-dimensional array. It would not depart from the spirit of the invention to have more cavities than microstructures. It is highly preferable that the wafer areas around the cavities, and the wafer areas corresponding to the bonding surrounds be continuous, i.e.

there will be no access holes or the like created which communicate with the cavity itself, i.e. the encapsulated microstructure-containing devices will be free of cavity-communicating passages" such as would later require sealing.

By the term "non-surface planarity-modifying doping procedure" is meant a doping procedure which is capable of modifying the current carrying capacity and/or carrier type within a region of a silicon wafer without increasing or decreasing the surface height or regularity such that bonding coplanarity of the surround areas cannot be maintained. Acceptable doping procedures generally show little and preferably no detectable change in the appearance of the wafer surface. By the term "non-silicon encapsulant" is meant an encapsulant other than silicon, doped silicon, polysilicon, etc. The term does not exclude siliceous encapsulants such as glass, ceramic, or silicone encapsulants. The majority of non-silicon encapsulants will be glass, ceramic, or thermoset or thermoplastic polymer. The term "bonding" in the claims should be interpreted to include both fusion bonding and anodic bonding, i.e. direct surface to surface bonding. If fusion bonding alone is contemplated, then the term "fusion bonding" is used appropriately.

Having now fully described the invention, it will be apparent to one of ordinary skill in the art that many changes and modifications can be made thereto without departing from the spirit or scope of the invention as set forth herein.

What is claimed is:

1. A process for the micromachining, and simultaneous encapsulating of a plurality of microstructures fabricated on a single planar silicon wafer, comprising:

defining a plurality of fusion bond surround areas on said planar silicon wafer;

fabricating a plurality of electronically active microstructures within said fusion bond surround areas such that said fusion bond surround areas are maintained in a substantially mutual co-planar condition;

providing electrical communication between electronically active portions of said microstructures and a plurality of microstructure-associated lead bond pads exterior to said fusion bond surround areas surrounding said microstructures by fabricating a plurality of conductive pathways between said microstructures and said associated bond pads through said fusion bond surround areas by doping portions of said fusion bond surround areas with a dopant material such that the conductive pathways are flush with the fusion bond surround;

positioning an encapsulating wafer on said planar silicon wafer, portions of said encapsulating wafer contacting said fusion bond surround areas;

directly bonding said planar and encapsulating wafers to form a bond along said fusion bond surround areas and between said wafers, such that said microstructures are located in cavities defined between surfaces on said planar silicon wafer and said encapsulating wafer.

2. The process of claim 1 wherein said plurality of microstructures are fabricated such that at least a portion of each of said microstructures is positioned above the plane of said fusion bond surround areas of said planar silicon wafer, and wherein said encapsulating wafer contains a plurality of cavities adapted to receive said microstructures.

3. The process of claim 1, further comprising:

defining a plurality of sets of one or more lead bond pads, each of said sets in communication with one or more electronically active portions of an associated microstructure, at least a portion of said lead bond pads positioned outside the fusion bond surround associated with said associated microstructure.

4. The process of claim 3 wherein said communication between said bond pad(s) and said electronically active portions of said associated microstructure is provided by ion implantation or diffusion of a dopant material to form one or more conductive pathways penetrating into said silicon planar wafer, said pathways connecting said bonding pad(s) and said electronically active portions of said associated microstructure.

5. The process of claim 3 wherein said encapsulating wafer contains a plurality of access windows such that said access windows provide access to said bond pads through said encapsulating wafer.

6. The process of claim 1 wherein said planar wafer comprises p-type silicon, wherein prior to fabricating said plurality of microstructures, said process further comprises forming a plurality of sets of one or more conductive areas, each set associated with a given microstructure, said step of forming provided by a non-surface planarity-modifying doping process to establish n+ conductive areas;

depositing an etchable mask on said p-type silicon wafer, said mask having a plurality of non-masked areas positioned at locations where a microstructure element is to be anchored to one of said conductive areas or to said p-type silicon wafer;

depositing polysilicon onto said mask and removing any unwanted polysilicon, forming a microstructure element having one or more portions of said element directly contacting said p-type silicon wafer, or one or more of said conductive areas; and etching away said etchable mask to release said microstructure element.

7. The process of claim 1 wherein said encapsulating wafer is prepared by the process of:

selecting a planar encapsulating wafer;

depositing a mask upon said encapsulating wafer such that a plurality of areas corresponding to the locations of microstructure-enclosing cavities are not coated with said mask;

etching said encapsulating wafer to form a plurality of cavities; and removing said mask.

8. The process of claim 7, further comprising:

depositing a second mask upon said encapsulating wafer such that a plurality of areas corresponding to desired access holes are not coated with said mask; and etching said wafer such that through holes are created at said plurality of areas corresponding to access holes.

9. The process of claim 1 wherein said encapsulating wafer is a silicon wafer, and said bonding comprises fusion bonding.

10. The process of claim 1 wherein said encapsulating wafer is a glass wafer or a glass-coated silicon wafer and said bonding comprises anodic bonding.

11. The process of claim 1, further comprising sawing said fusion bonded wafers into a plurality of individual, encapsulated microstructures; and bonding electrical leads onto bonding pads communicating with said individual encapsulated microstructures through access windows provided in said encapsulating wafer.

12. The process of claim 11, further comprising additionally encapsulating said individual encapsulated microstructures with a non-silicon encapsulant.

13. The process of claim 12 wherein said step of additionally encapsulating comprises encapsulating said individual encapsulated microstructures within a thermoplastic or thermosetting polymer housing.

14. An encapsulated microstructure prepared by the process of claim 1.

15. The microstructure of claim 14 wherein said microstructure comprises a strain gauge or an accelerometer sense element.

16. The microstructure of claim 15 wherein said microstructure provides a changing capacitance in response to external stimuli.

17. An encapsulated microstructure prepared by the process of claim 5.

18. An encapsulated microstructure prepared by the process of claim 8.

19. A silicon-encapsulated microstructure prepared by the process of claim 9.

* * * * *